US009425826B2

United States Patent
Harris-Dowsett

(10) Patent No.: US 9,425,826 B2
(45) Date of Patent: Aug. 23, 2016

(54) INTERLEAVER EMPLOYING QUOTIENT-REMAINDER REORDERING

(71) Applicant: Black Berry Limited, Waterloo (CA)

(72) Inventor: Damian Kelly Harris-Dowsett, Cambridge (GB)

(73) Assignee: BlackBerry Limited, Waterloo, Ontario (CA)

( * ) Notice: Subject to any disclaimer, the term of this patent is extended or adjusted under 35 U.S.C. 154(b) by 204 days.

(21) Appl. No.: 13/667,923

(22) Filed: Nov. 2, 2012

(65) Prior Publication Data

US 2014/0129600 A1    May 8, 2014

(51) Int. Cl.
H03M 13/27    (2006.01)
G06F 17/10    (2006.01)

(52) U.S. Cl.
CPC .......... *H03M 13/2739* (2013.01); *G06F 17/10* (2013.01); *H03M 13/2714* (2013.01)

(58) Field of Classification Search
CPC ............ H04L 1/0071; H03M 13/2714; H03M 13/2725

See application file for complete search history.

(56) References Cited

U.S. PATENT DOCUMENTS

| | | | |
|---|---|---|---|
| 6,598,198 B1 * | 7/2003 | Furuta et al. .................. | 714/763 |
| 2005/0154954 A1 * | 7/2005 | Maru ................ | H03M 13/2714 714/746 |
| 2009/0138668 A1 * | 5/2009 | Blankenship .................. | 711/157 |
| 2010/0064197 A1 * | 3/2010 | Halter ........................... | 714/755 |

OTHER PUBLICATIONS

3rd Generation Partnership Project, Technical Specification Group Radio Access Network; Evolved Universal Terrestrial Radio Access; Multiplexing and Channel Coding, 2007, 3GPP Organizational Partners, V8.1.0, pp. 1-39.*
Ahmed et al.; "Recursive Parallel Interleavers for Two-Phase Error Control Decoders," Proc. IEEE 6th International Symposium on Turbo Codes & Iterative Information Processing; Sep. 6, 2010; 5 pages.
Ilnseher et al; "A Monolithic LTE Interleaver Generator for Highly Parallel SMAP Decoders;" Proc. IEEE Wireless Telecommunications Symposium; Apr. 13, 2011; 4 pages.
Ahmed et al.; "A High Throughput Turbo Decoder VLSI Architecture for 3GPP LTE Standard;" Proc. 14th International Multitopic Conference; Dec. 22, 2011; 7 pages.
Extended European Search Report from related European Patent Application No. 12191162.2 dated Feb. 27, 2013.
Canadian Office Action dated Jul. 8, 2015, received for Canadian Application No. 2,831,925.

* cited by examiner

*Primary Examiner* — Andrew Caldwell
*Assistant Examiner* — Calvin M Brien
(74) *Attorney, Agent, or Firm* — Jeffrey N. Giunta; Fleit Gibbons Gutman Bongini & Bianco P.L.

(57) ABSTRACT

A method of generating an interleaved symbol sequence location from a symbol location of a symbol sequence comprises determining the interleaved symbol location based on an interleaver sequence function which relates a linear symbol location to the interleaved symbol location. This is done by acquiring values of the interleaver sequence function in quotient and remainder form and then calculating the interleaved symbol location by performing operations of the interleaver sequence function in quotient and remainder form.

16 Claims, 6 Drawing Sheets

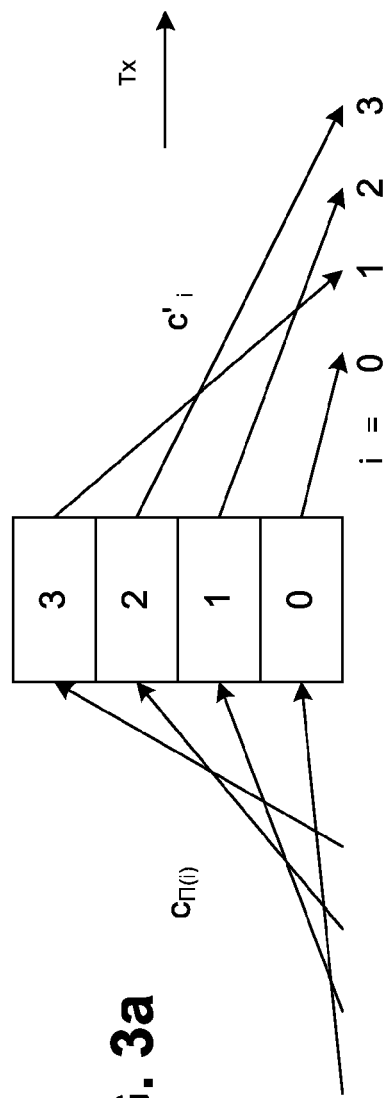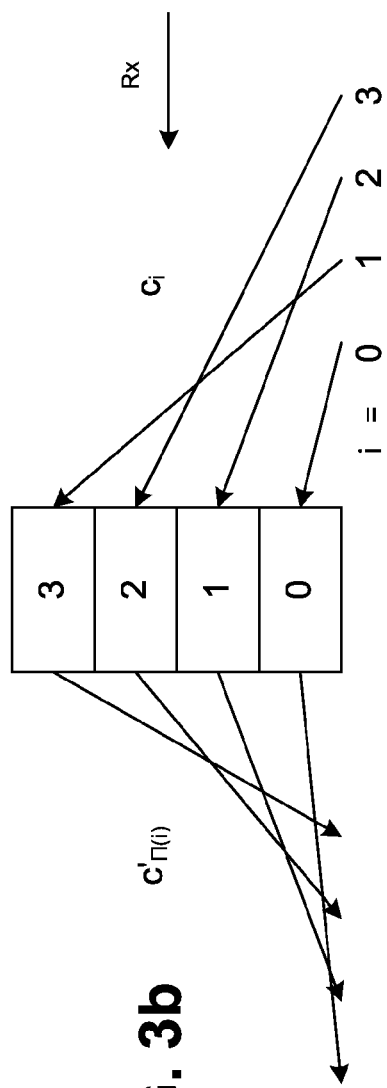

INTERLEAVER EMPLOYING QUOTIENT-REMAINDER REORDERING

FIELD OF THE DISCLOSURE

The present disclosure concerns an interleaver and interleaving process which employ an improved technique for deriving interleaved bit locations

BACKGROUND

Interleaving is a process of reordering a sequence of bits, data, symbols or information which is contained in a data sequence, for example by reordering the bits, data, symbols or information in a predefined or pseudo-random manner. Apparatus which performs interleaving is herein referred to as an "interleaver".

Turbo interleavers are interleavers which are used in the generation of turbo codes, and are used at the output of a first encoder element before the reordered data from the interleaver is further encoded by a second encoder element. Interleaving in the context of turbo encoding means that the separate encodings produced by the two encoder elements are generally uncorrelated. Thus, the outputs of the two encoder elements can then be combined to produce an encoded data sequence which has good error correction performance.

Many interleavers determine the reordering sequence of their input bits, data, symbols or information based on an "interleaver sequence function" which is a mathematical function which takes the position of an input bit, data item, symbol or information block and derives a corresponding output position in the output stream of bits, data, symbols or information.

In existing encoders and decoders, calculation of the interleaver sequence function involves an implementation in hardware or equivalent software. Often, the values that are being determined in the processing of the interleaver sequence function can become large. This means that the processing logic is relatively complex and thus the processing and calculation of interleaved bit sequences is demanding. This can increase circuit complexity, size and cost, as well as increase power consumption which, for mobile applications, can cause a reduction in battery life. It is thus desirable to reduce and simplify the logic required to implement the interleaver sequence function.

BRIEF DESCRIPTION OF THE DRAWINGS

Reference is made below to the accompanying drawings in which:

FIGS. 3a and 3b are schematics showing how bits or symbols according to the present disclosure may be reordered;

DESCRIPTION

Figure 1:
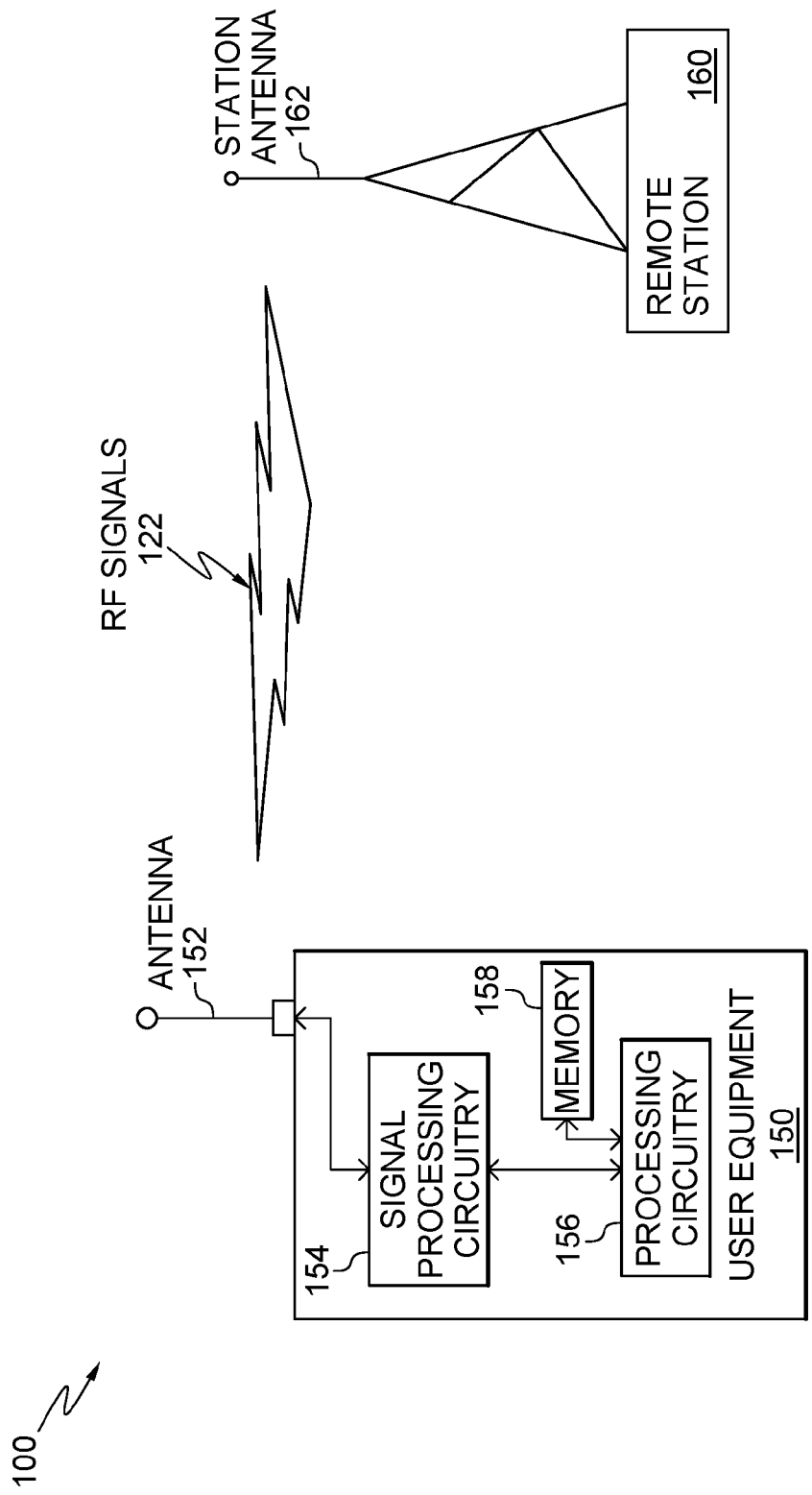
FIG. 1 is a schematic of a communication system according to the present disclosure.

Reference is made below to one or more particular examples which are not intended to be limiting on the scope of the disclosure.

In a first aspect, a method of generating an interleaved symbol location from a linear symbol location of a symbol sequence may comprise: determining the interleaved symbol location based on an interleaver sequence function which relates a linear symbol location to the interleaved symbol location by: acquiring parameters of the interleaver sequence function in quotient and remainder form; calculating the interleaved symbol location by performing operations of the interleaver sequence function in quotient and remainder form; and outputting the determined interleaved symbol location.

In performing the aforementioned method, the interleaver sequence function may be $\Pi(i)=(f_1 \times i + f_2 \times i^2) \mod wgs$, wherein i is the linear symbol location, and wgs, $f_1$ and $f_2$ are pre-defined constants. wgs, $f_1$ and $f_2$ may comprise one or more of the values defined according to Table 2 below.

$f_1$ and $f_2$ may be expressed in quotient and remainder form, $f_1[q,r]$ and $f_2[q,r]$, where q is the quotient of $f_1$ or $f_2$ in integer form and r is the remainder of $f_1$ or $f_2$ in integer form with respect to wgs. $f_1$ and $f_2$ may be stored in quotient and remainder form in memory, and obtained therefrom. Multiple values for $f_1[q,r]$ and $f_2[q,r]$ in quotient and remainder form are stored in and acquired from memory. wgs may equate to K/P, wherein P is a parallelisation factor and K is code block size of the symbol sequence.

The step of calculating may comprise at least one lookup operation and at least one iterative shift-add operation. Moreover, determining the interleaved symbol location may be an iterative determination based on one or more successive symbol locations and their one or more corresponding determined interleaved symbol locations.

In a second aspect, a non-transitory computer readable medium has computer executable instructions stored thereon, when executed, perform the aforementioned method.

In a fourth aspect, an interleaver for generating an interleaved symbol location from a linear symbol location of a symbol sequence may comprise: a processing circuit configured to determine the interleaved symbol location based on an interleaver sequence function which relates a linear symbol location to the interleaved symbol location by: acquiring parameters of the interleaver sequence function in quotient and remainder form; and calculating the interleaved symbol sequence location by performing operations of the interleaver sequence function in quotient and remainder form, wherein the processing circuit is further configured to output the determined interleaved symbol location.

The interleaver can perform interleaving and de-interleaving operations since the interleaver sequence function may be reversible. This is to say a linear symbol sequence input to the interleaver can be reordered such that an interleaved symbol sequence is output, or a interleaved input sequence input to the interleaver can be reordered such that a linear symbol sequence is output.

For the aforementioned interleaver, the interleaver sequence function may be $\Pi(i)=(f_1 \times i + f_2 \times i^2) \mod wgs$, wherein i is the linear symbol location, and wgs, $f_1$ and $f_2$ are pre-defined constants. wgs, $f_1$ and $f_2$ may comprise one or more of the values defined according to Table 2 below. $f_1$ and $f_2$ may be expressed in quotient and remainder form, $f_1[q,r]$ and $f_2[q,r]$, where q is the quotient of $f_1$ or $f_2$ in integer form and r is the remainder of $f_1$ or $f_2$ in integer form with respect to wgs. $f_1$ and $f_2$ may be stored in quotient and remainder form in memory, and obtained therefrom. Multiple values for $f_1[q,r]$ and $f_2[q,r]$ in quotient and remainder form are stored in and acquired from memory. wgs may equate to K/P, wherein P is a parallelisation factor and K is code block size of the symbol sequence.

The processing circuit may be configured to perform at least one lookup operation and at least one iterative shift-add operation during calculation of the interleaved symbol sequence index. These operations may be performed using quotient and remainder operations.

The processor may be configured to determine interleaved symbol locations by performing an iterative determination based on one or more preceding or successive symbol locations and their one or more corresponding determined interleaved symbol locations.

In a fourth aspect, a device comprising the aforementioned interleaver may store multiple values for $f_1[q,r]$ and $f_2[q,r]$ in quotient and remainder form, wherein the processing circuit is configured to acquire values for $f_1[q,r]$ and $f_2[q,r]$ in quotient and remainder form from the memory.

The device may comprise an encoder configured for encoding a symbol sequence and perform an interleaving operation by successively passing a linear symbol location of the symbol sequence to the aforementioned interleaver and thereby obtain a corresponding interleaved symbol location from the interleaver.

The device may comprise a decoder which may be configured for decoding an interleaved symbol sequence and perform a de-interleaving operation by successively passing an interleaved symbol location of the symbol sequence to the aforementioned interleaver and thereby obtain a corresponding linear symbol location from the interleaver.

In a fifth aspect, user equipment for use in a telecommunications network may comprise the aforementioned device.

In the aforementioned interleaver and method, each symbol may comprise one or more bits, may comprise a single bit, or may be a single bit. Each symbol sequence (input or output) may be a bit sequence and each symbol location may be a bit location. The reference to a symbol or bit location may be a reference to a symbol or bit index respectively within the corresponding symbol or bit sequence. The linear sequence may be defined as a non-interleaved sequence and be the sequence that is input or output from the interleaver.

FIG. 1 is an example of a communication system 100 which could employ the present invention. The communication system 100 comprises user equipment (UE) 150 which may be a communication device, such as a mobile device or phone, portable computing device, e.g. laptop or tablet device, or any other device which is adapted to communicate with the system 100. The user equipment (UE) 150 comprises processing circuitry 156 in communication with memory 158. The processing circuitry 156 is also in communication with signal processing circuitry 154 which is connected to antenna 152. The user equipment 150 may also include many other commonplace features which are likely to well-understood by the skilled person. These commonplace features are not shown in FIG. 1 since they are not the direct subject of the present invention, but may include a display screen, keypad or keyboard, touchscreen, power supply, such as a battery, input/output interfaces. Such commonplace features may be directly or indirectly connected to each other, to the processing circuitry 156, memory 158 and/or signal processing circuitry 154, and be in direct or indirect communication with each other, the processing circuitry 156, memory 158 and/or signal processing circuitry 154.

The communication system 100 also comprises a remote station 160, which may be a mobile station (MS), such as a mobile base station or any other device which is capable of communicating within the system 100 and with the user equipment 150. The station 160 may comprise station antenna 162 and signal processing and control circuitry (not shown), which may be directly or indirectly connected to the station antenna 162, and which may be similar or identical to the components of the user equipment as herein described.

Radio frequency (RF) signals 122 are generated by the user equipment 150 and the station 160 and pass between each other via the antenna 152 and station antenna 162, thereby permitting bi-directional communication between the user equipment 150 and the station 160. The RF signals 122 are modulated or demodulated by the user equipment 150 and/or the station 160 according to one or more modulation/demodulation schemes, which permits data, for example digital data, to be transmitted between the station 160 and the user equipment 150. The modulation schemes implemented by the communication system 100 including the user equipment 150 and station 160 may conform to one or more of the schemes defined by Global System for Mobile Communications (GSM), 3rd Generation (3G) mobile communication, 3rd Generation Partnership Project (3GPP) and Long Term Evolution (LTE). The resulting communication network which is formed by the user equipment 150 (or a plurality thereof) and the station 160 (or a plurality thereof) may be a cellular communication network, such as a cellular network conforming to one or more of GSM, 3G, 3GPP and LTE.

Figure 2:
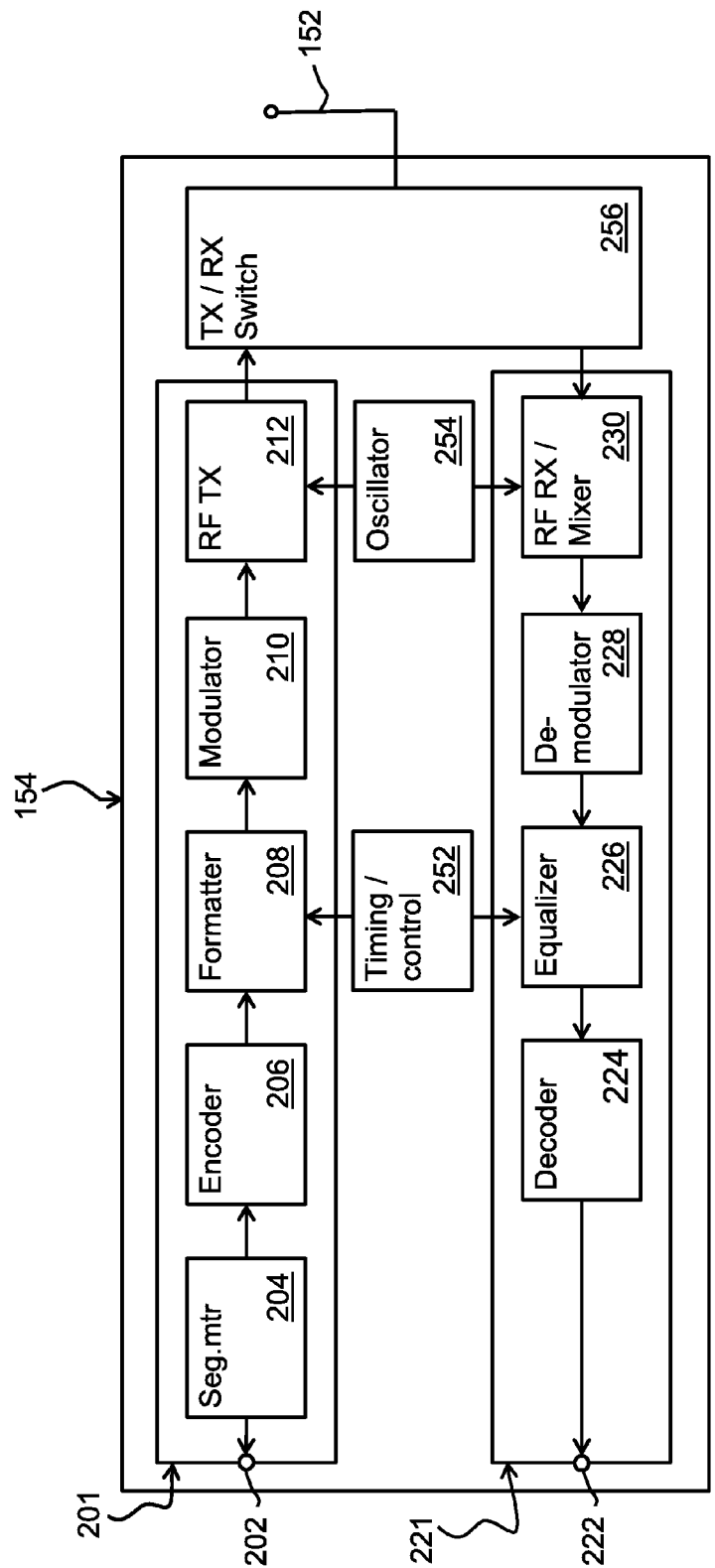
FIG. 2 is a schematic of signal processing circuitry which could be employed in the communication system of FIG. 1.

FIG. 2 is a generalised schematic of the signal processing circuitry 154 that might be employed comprising, at a transmitter 201: a transmitter input 202, a segmenter 204, an encoder 206, for example a turbo encoder, a formatter 208, a modulator 210; a radio-frequency (RF) transmitter 212. In addition, at a receiver 221, there is: a receiver output 222; a decoder 224, for example a turbo decoder, an equalizer 226, a demodulator 228; and a mixer 230.

For both the transmitter 201 and receiver 221, there may also be hardware which is shared, such as: the antenna 152 for receiving the RF signals 122 from the communications network, timing and control circuitry 252, and an oscillator 254, along with transmitter-receiver switch 256.

The transmitter 201 receives a digital data stream via transmitter input 202 and this data stream is fed to segmenter 204 where fixed-length data blocks of block size, K, are formed. These fixed-length data blocks are then passed to the encoder 206 which encodes the fixed length data blocks and sends the encoded data blocks successively as an encoded data stream to the formatter 208. The formatter 208 generates, at a prescribed time and with a prescribed amplitude, signal bursts, each comprising a series of waveforms. These bursts are passed to modulator 210 where each burst is modulated to RF frequency by mixing it with a carrier having a known frequency. The transmitter 201 then transmits each modulated burst as the RF signal 122 when the transmitter-receiver switch 256 connects the antenna 152 to the transmitter 201. The oscillator 254, which is connected to the modulator 210 tracks timing and is used by the modulator 210 to generate the carrier waveform. The timing and control circuitry 252 controls the formatting and timing of the bursts as generated by the formatter 208.

For the receiver 221, when the antenna 152 receives the RF signal 122 containing a burst and the radio frequency (RF) receiver/mixer 230 is connected to the antenna 152 via the switch 256, the received burst is amplified in the radio frequency (RF) receiver/mixer 230, and then demodulated in the demodulator 228 so as to remove the RF carrier. The equalizer 226 filters each demodulated burst to produce an enhanced digital signal which is next decoded by decoder 224.

The decoder 224 comprises a concatenation of individual decoder elements (not shown) and an interleaver (see below). By using feedback from each decoder and passing data through the interleaver (see below), each received burst can be decoded, and can then be passed as needed through receiver output 222 to the processing circuitry 156 within the user equipment 150 for use and/or further processing.

Figure 3:
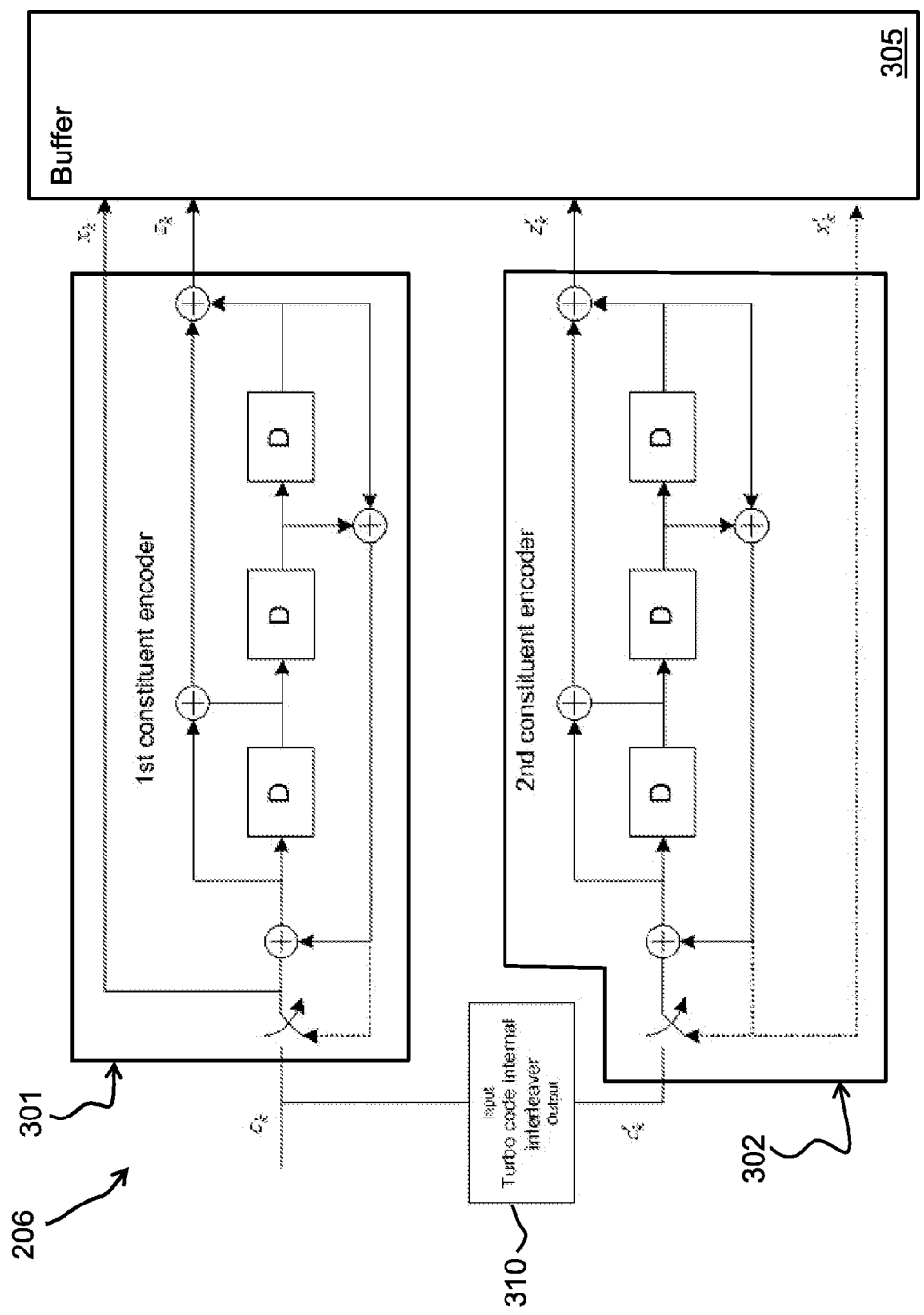
FIG. 3 is a schematic of the functional components of an encoder which could be employed in the circuitry of FIG. 2.

FIG. 3 is a schematic of functional elements of the encoder 206, which may be implemented in hardware, or implemented in software executable on dedicated or shared processing circuitry, or implemented partially for certain elements in software, with other elements implemented hardware. The processing circuitry 156 may perform all or certain elements of the signal processing of the encoder 206 as described below. Alternatively, or in addition, the signal processing circuitry 154 may comprise dedicated processing circuitry and memory for performing all or certain elements of the signal processing as described below.

The example encoder 206 depicted in FIG. 3 includes two constituent encoder elements 301, 302. These encoder elements 301, 302 are both coupled to an interleaver 310. Each encoder element 301, 302 comprises, in the example shown in FIG. 3: modular adders (or binary adders) ("+"); shift register delay elements (or "shift registers") ("D"); and a switch. As shown in the example of FIG. 3, data, bits or information is/are output from each encoder element 301, 302 to a buffer 305. Data, bits or information, $c_k$, is/are also output from encoder element 301 to the interleaver 310. Reordered data, bits or information, $c'_k$, are then output from the interleaver 310 to encoder element 302. The function of the encoder elements 301, 302 is described in one example according to the 3rd Generation Partnership Project (3GPP) (see 3GPP Technical Specification 36.212 v 11.0.0 as herein incorporated by reference, with particular reference to section 5.1.3.2).

The interleaver employed in 3GPP TS 36.212 determines the order of output bits with respect to the input data, bits or information according to a pre-defined function. In particular, the relationship between the input and output bits can be defined by the following expression:

$$c'_i = c_{\Pi(i)}, i=0, 1, \ldots, (K-1) \quad \text{(Eq. 1)},$$

where the data, bits or information input to the interleaver, for example the interleaver 310 as depicted in FIG. 3, are denoted by $c_0, c_1, \ldots, c_{K-1}$, and where K is the number of input bits, commonly referred to as the block size. The data, bits or information output from the interleaver, for example the interleaver 310 as depicted in FIG. 3, are denoted by $c'_0, c'_1, \ldots, c'_{K-1}$.

The order of bits in Eq. 1 is reversible in the sense that there can simply be a transformation from a given input bit location to an output bit location, and this transformation can be defined by an interleaver sequence function (see below) for reordering bits or symbols in a linear input bit or symbol sequence. In the specific examples described below, reference is made to the reordering of individual bits in a bit sequence. However, it will be appreciated that the reordering of bits is a subset of the reordering of symbols, whereby one or more bits constitute a symbol within a symbol sequence. Hence, the principles disclosed below concerning bit reordering are equally applicable to the more general scenario whereby symbols are reordered. According to the invention as defined by the claims, a symbol may be a bit, e.g. a single bit, or it may be a group of one or more bits. An input symbol sequence may be reordered to generate a reordered output symbol sequence whereby the groups of one or more bits making up each symbol have been reordered. The location of a given symbol or bit in the input sequence may designated by or equate to an index, e.g. $\Pi(i)$, and the location of a given symbol or bit in the output sequence may be designated by or equate to an index, e.g. i. $\Pi(i)$ is an example of a value determined by an interleaver sequence function (see below).

In an implementation of the interleaver (see FIG. 3a) for encoding, the input and output bits may simply be stored in a buffer 370 and bits are input in a linear fashion into the buffer and read out in an order according to the interleaver sequence function. In an implementation of the interleaver (see FIG. 3b) for decoding, the bits can also be input into the buffer in an order according to the interleaver sequence function and output in a linear fashion.

The relationship between the indices of the input and output bits can be determined according to 3GPP TS 36.212 from the following expression:

$$\Pi(i) = (f_1 \cdot i + f_2 \cdot i^2) \bmod K \quad \text{(Eq. 2)},$$

where the parameters $f_1$ and $f_2$ are defined according to the block size K and are summarized in Table 5.1.3-3 of 3GPP TS 36.212, which is herein incorporated by reference.

In existing encoders and decoders, calculation of $(f_1 \cdot i + f_2 \cdot i^2)$ is implemented in hardware, or in equivalent software, employing three multiplier elements and one adder element. Due to the values of $f_1$ and $f_2$ and block size K defined according to in Table 5.1.3-3 of 3GPP TS 36.212, the result of $(f_1 \cdot i + f_2 \cdot i^2)$ can be very large, e.g. greater than 30 bits, perhaps, 31, 32, 33, 34 or 35 bits in length. For example. from Table 5.1.3-3 of 3GPP TS 36.212, for K=5248, $f_1$=113 & $f_2$=902 and a max value of i=5247: $\Pi(i)=(113\times5427+902\times54272)$ mod 5428=26566614009 mod 5428.

where 26566614009 is a large number which requires 35 bits to represent it. The application of mod K to the large value which is obtained from $(f_1 \cdot i + f_2 \cdot i^2)$ thus involves considerable divider logic which can be complex to implement and inefficient in processing.

Figure 4:
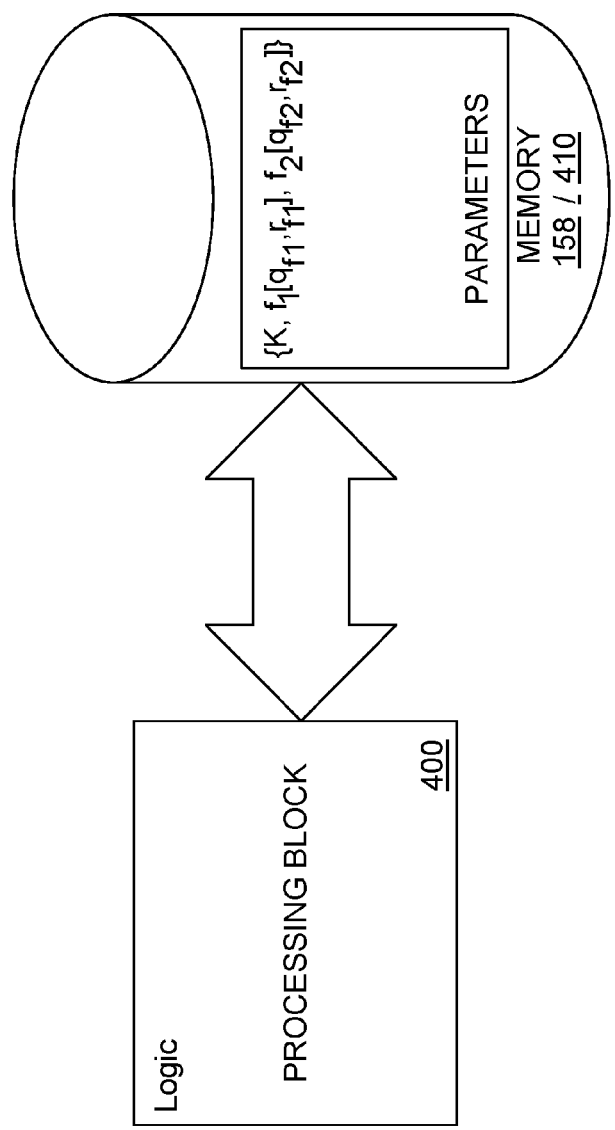
FIG. 4 is a schematic of functional components of an interleaver of the present disclosure.

The functional elements or logic in the example interleaver 310 are shown in FIG. 4. These functional elements or logic may be implemented in dedicated hardware, or implemented in software executable on dedicated or shared processing circuitry, or implemented partially for certain elements in software, with other elements implemented hardware. These functional elements or logic implement the general process 500 described below with reference to FIG. 5.

As shown in FIG. 4, the example interleaver 310 comprises a processing block 400 in communication with a memory 410 which stores parameters of an interleaver sequence function in quotient and remainder form. For example, the interleaver sequence function may be $\Pi(i)=(f_1 \times i+f_2 \times i^2) \bmod K$, as, for example, defined in 3GPP TS 36.212 section 5.1.3.2.3, in which case the parameters $f_1$, $f_2$ and/or K may be stored in the memory in quotient and remainder form. Also, i is a linear input bit sequence location, and K (block size), $f_1$ and $f_2$ are pre-defined parameters.

In particular, K may be specified in terms of a parallelisation factor whereby interleaver processing within the processing block 400 can be used by P decoding processor elements (not shown) operating in parallel. P is defined as a power of 2, so in the case where the largest value of K is 6144, as specified in in 3GPP TS 36.212, Table 5.1.3-3 and section 5.1.2, and each decoding processor services, for example, 192 bits, the largest value of P will be 32, in which case the values for P for the values in 3GPP TS 36.212, Table 5.1.3-3 are from the set $\{1, 2, 4, 8, 16, 32\}$. Since the decoding processor elements can operate in parallel, this means that the interleaver bit sequence expression can be written as $\Pi(i)=(f_1 \times i+f_2 \times i^2) \bmod wgs$, where wgs is the window group size defined as K/P.

The values $f_1$, $f_2$ and K may thus be expressed and/or directly stored in the memory 410 in terms of K (or P and wgs), $[q_{f1}, r_{f1}]$, $[q_{f2}, r_{f2}]$ (generalised as $f_X[q_{fX}, r_{fX}]$), where:

$$q_{fX} = f_X/wgs$$

$$r_{fX} = f_X \bmod wgs$$

Exemplary values which might be stored in memory 410 and accessed from the memory 410 when deriving Π(i), for example, are shown in the final column of Table 1 below:

TABLE 1

Exemplary values of {K, f$_1$[q$_{f1}$, r$_{f1}$], f$_2$[q$_{f2}$, r$_{f2}$]}

| {K, f1, f2} | P | wgs | {K, f$_1$[q$_{f1}$, r$_{f1}$], f$_2$[q$_{f2}$, r$_{f2}$]} |
|---|---|---|---|
| {928, 15, 58} | 8 | 116 | {928, [0, 15], [0, 58]} |
| {3008, 157, 188} | 32 | 94 | {3008, [1, 63], [2, 0]} |
| {6144, 263, 480} | 32 | 192 | {6144, [1, 71], [2, 96]} |

All applicable values of {K, [q$_{f1}$,r$_{f1}$], [q$_{f2}$,r$_{f2}$]} which may be stored in memory 410 and accessed from the memory 410 when deriving Π(i), for example, are shown in the final column of Table 2 which is below.

For an information bit sequence or block having a particular block size, K, corresponding to the number of bits in the sequence or block, the corresponding values of [q$_{f1}$,r$_{f1}$], [q$_{f2}$, r$_{f2}$] are selected from memory and may then be utilised to obtain interleaved bit sequence locations from non-interleaved/input bit sequence locations according to the general process described below. The functional elements or logic in the example interleaver 310 may be implemented in a computer readable medium, for example a non-transitory computer readable medium, having computer executable instructions stored thereon, which, when executed by a processor constituting the processing block 400, perform a general process 500 described below with reference to FIG. 5. However, a suitable implementation may be to implement the processing block 400 in hardware components comprising processing elements, such as multiple-shift adder components.

For the specific example where the interleaver sequence function, $\Pi(i)=(f_1 \times i+f_2 \times i^2) \bmod K$, since turbo decoding processing is carried our across P parallel decoding processors of length wgs, where wgs=K/P, the interleaver derivation for each processor can be said to be $\Pi(i)=(f_1 \times i+f_2 \times i^2) \bmod wgs$. All processors, P may use and process precisely the same linear i location index and return the same interleaved Π(i), index. As a result, there may only be one interleaver processing block 400 to service all of the P decoding processors. Since all processors, P, use the same indexes, their data memory accesses can all use the same memory address from one single memory 410.

For this specific example, applying the general principles of the invention, the interleaver quotient-remainder parameters from memory 410 are obtained for a particular value of wgs (where wgs=K/P):

$$\Pi(i)=([q_{f1},r_{f1}] \times i+[q_{f2},r_{f2}] \times i^2) \bmod wgs,$$

where the bit sequence index, i is in range {0:wgs-1} and that Π(i) is just an interleaved re-ordered value of the index, i, and is also in the range {0:wgs-1}. The "mod wgs" processing is commutative. The aforementioned application of the invention permits the processing to be broken down into its smallest parts and values to be obtained incrementally by keeping all internal result values within the {0:wgs-1} range.

In all quotient-remainder ("[q,r]") processing, all [q,r] balances may generally be maintained. The remainder ("[r]") term should generally remain in the {0:wgs-1} range. However the quotient ("[q]") value can increase in value, but may be kept below mod P since it has the effect of multiplexing the interleaved data from memory back to a target processor. This is achieved because the final [q] value provides information about how to configure an external shuffle matrix for bit re-ordering, for example in an LTE interleaver. In particular, the interleaved [q] value output based on the interleaver sequence function in quotient-remainder form constitutes an interleaver shuffle index for mapping Π(i) across all P processors. In this regard, it should be recalled that the interleaver 310 has performed reordering across its wgs range, and not K bits. Hence, the [q] output value permits the reordering performed for each processor to be mapped into a reordering for all K bits.

Figure 5:
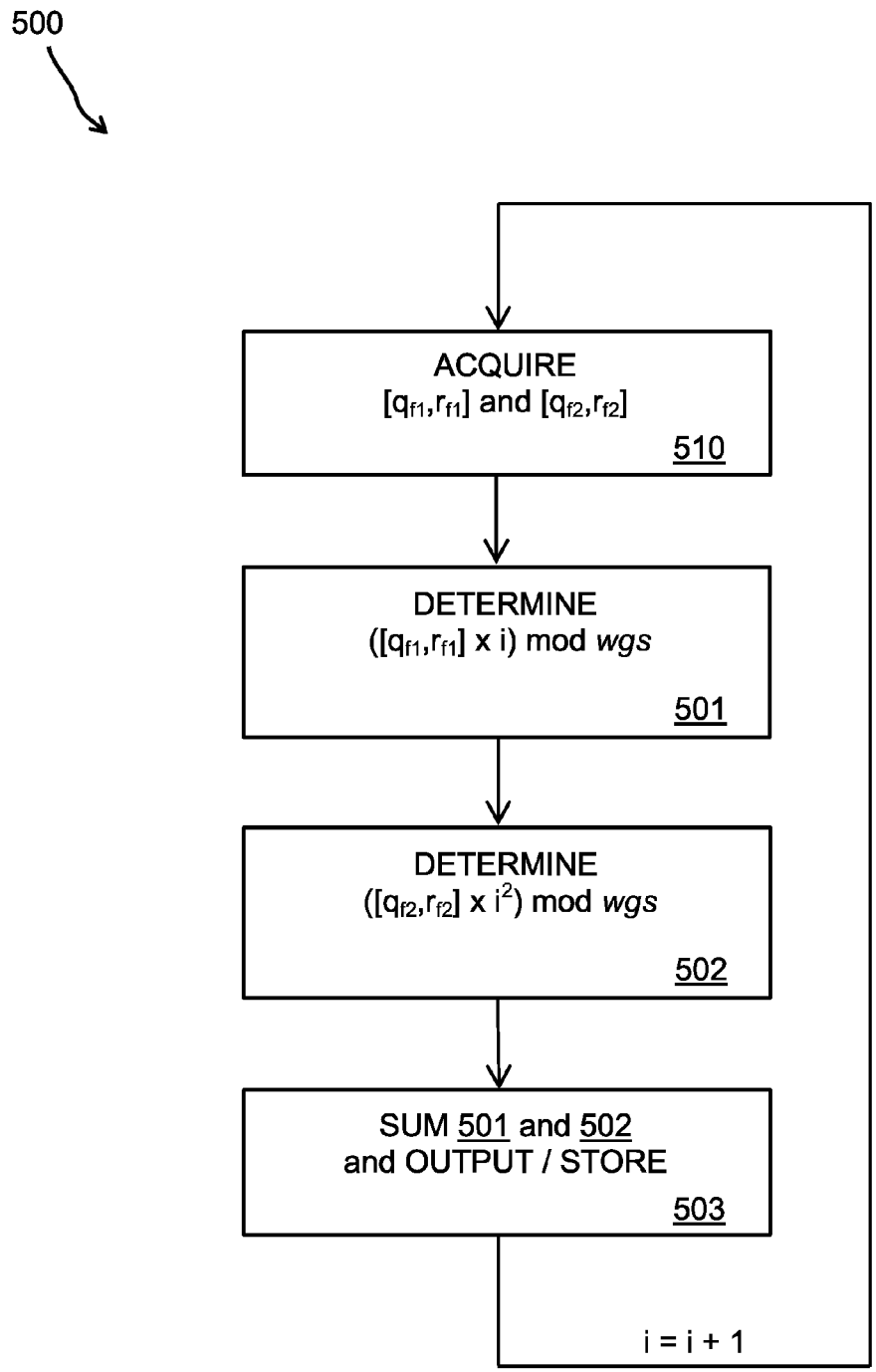
FIG. 5 is a flow diagram of steps which could be performed by an interleaver of the present disclosure.

With reference to FIG. 5, the process 500 is depicted in which interleaved or re-ordered bit locations may be generated from successive bit locations of an input bit sequence or block utilising quotient and remainder ("[q,r]") values of parameters of the interleaver sequence function. In general, the process 500 acquires, in step 510, [q$_{f1}$,r$_{f1}$] and [q$_{f2}$,r$_{f2}$] from memory for a particular K value, or wgs value based on P. The process 500 then calculates $\Pi(i)=([q_{f1},r_{f1}] \times i+[q_{f2},r_{f2}] \times i^2) \bmod wgs$, for each non-zero bit at location i, whereby there are two determinations, specifically: (i) determination ([q$_{f1}$, r$_{f1}$]×i) mod wgs (step 501); and (ii) determination of ([q$_{f2}$, r$_{f2}$]×i$^2$) mod wgs (step 502); and (iii) followed by a sum of the results of (i) and (ii) (step 503) to generate an output which is an interleaved bit location.

According to step 503, an interleaved bit location is derived which can be output to memory, for example to a lookup table storing the correspondence between input bit sequence location and output bit location. Alternatively, the actual bit located at the input bit location is placed into an output register at the derived interleaved bit location. When all the bits in the input bit sequence (up to a block size, K) have been reordered, or their interleaved positions determined, the process 500 terminates. At this point, the entire interleaved bit sequence from the output register is output, or, if not already generated, is generated based on the interleaved locations located in the lookup table (see FIG. 3a above). The interleaver sequence stored in memory (either directly by storage of the bit index, or by virtue of the location of the data itself) can be used for both a read from a linear memory and as a write to a memory whose data is required to be stored in interleaved order (c.f. encoding and decoding of data). By this arrangement, the same interleaver sequence function, e.g. Π(i), can be used to interleave and de-interleave.

EXAMPLE

An example application of the process 500 for {K, f$_1$, f$_2$} being {4608, 337, 480} is now described where P=32. Hence, wgs=144. Thus, {K, [q$_{f1}$,r$_{f1}$], [q$_{f2}$,r$_{f2}$]} for this particular example is {4608, [2,49], [3, 48]} (see Table 2 below). It should be recalled that {i,Π(i)} can be any value from 0 to 143 for wgs=144. Π(i) is always returned in the [q,r] format. [r] is used because that is the local interleaved address, i.e. it provides the result, and [q] permits the higher level wgs-to-K shuffle to occur when utilising P processors. The example process disclosed below operates in the [q,r] domain from the outset, rather than transforming at the end, as in conventional interleavers.

For the determination in step 501 of P×([q$_{f1}$,r$_{f1}$]×i) mod wgs, at each step i·f$_1$ is compared with wgs. If i·f1 is larger than wgs, subtract wgs (perform modulation) and increment q by reducing to floor. According to an example of the invention, e.g. for i=37, the processing block 300 iterates starting from:

37·[q:2, r:49] mod 144

[q: 74, r: 1813] mod 144
which is reduced to floor as follows:
[q: 74+12, r: 85]
where 12 is obtained from: 1813/144, and 85 is obtained from: 1813 mod 144
[q: 86, r: 85]
which corresponds to a calculation of:

[q: 22, r:85]

For comparison, the direct approach would have yielded:

37·337 mod 144

12469 mod 144

[q: 22, r: 85]

For the determination in step 502 of P×([$q_{f2}$,$r_{f2}$]×$i^2$) mod wgs, the $i^2$ mod wgs portion can be reduced to a single clock cycle operation by on the basis described below. [$q_{f2}$,$r_{f2}$] and their wgs for all interleaver parameters have a relationship that can be exploited.

According to the example for i=37, the processing block 300 iterates starting from:

i·i·[$q_{f2}$,$r_{f2}$] mod wgs ((i·i mod wgs)·[$q_{f2}$,$r_{f2}$]) mod wgs
((i·i mod cf)·[$q_{f2}$,$r_{f2}$]} mod wgs This calculation can be performed by recalling that {K,$f_1$, $f_2$} is {4608, 337, 480}, where 96 now factors into both 4608 and 480, and 4608 is 96×48, where this 48 value defines which common family that K=4608 falls into.

There are only six common family values for the values of K, P and wgs in 3GPP TS 36.212, Table 5.1.3-3 which are {64, 48, 40, 112, 18, 54} (see Table 3 below).

Each common family value has a corresponding i·i mod cf table (see Table 3 below). For example, for cf=48, i·i mod cf={0,1,4,9,16,25,36,1,16,33,4,25,0} which, as for all the sets of values for each cf value, has a repeat sequence about its end value (i.e. final "0"), so cf/2 can be considered, and a reflection from the end of the sequence can be utilised.

Thus, in determining 37·37 mod 48, i=37 can be used as an index into the table for the cf=48 value. Since, as stated above the sequence reflects, mod (48/2=24) cen be calculated. Hence, 37 mod 24 is 13, which yields 25 for i·i mod cf since the 13th element in the table for cf=48 is 25 (reflected back and the index count has started from zero).

Thus:

((i·i mod cf)·[$q_{f2}$,$r_{f2}$]} mod wgs

25·[$q_{f2}$,$r_{f2}$] mod wgs
25·[q:3, r:48] mod 144

The processing block 400 then iterates 25·[q:3, r:48] mod 144 as:

[q:75, r:1200] mod 144

[q:75+8, r:48]
[q:19, r:48]

where q has been reduced mod 32 and 8 is obtained from 1200/144 and 48 is obtained from 1200 mod 144.

For comparison, the direct approach would have yielded:

i·i·$f_2$ mod wgs 657120 mod 144
[q:4563, r:48]
[q:19, r:48]

It can thus be seen that the direct approach for the determination in the examples of steps 501 and 502 above performs a multiply, and then does a divide, whereas the jump-based determination of the process 500 performed by the processing block 400 (not limited to the above-mentioned specific example) is reduced to one or more lookups from memory 410, and one or more iterative shift-add operations, by storing the {$f_1$,$f_2$} parameters as their mod wgs [q,r] equivalents in memory 410, and obtaining these {$f_1$,$f_2$} in their quotient-remainder form for a given value of K when performing interleaving using the interleaver sequence function. This significantly reduces the hardware both in terms of the operations performed and the bit widths of all on-going calculations. It also significantly reduces the time taken to compute the interleaved bit sequence values. In essence, through using this technique, the architecture is able to step towards a result, rather than over-calculate interim values and then trimming them away (with divide functions), as per the direct, conventional approach.

Applying the aforementioned process, the functional elements or logic in the interleaver 310 which are thus necessary to relate the indices of the input bits, $c_k$, to the corresponding indices of the output bits, $c'_k$, can be significantly reduced vis-à-vis existing interleavers.

It will be appreciated that the invention has been described above by way of examples, and that modifications departing from the examples may be applicable within the scope of the invention, which is defined by the appendant claims.

TABLE 2

Values of {K, [$q_{f1}$, $r_{f1}$], [$q_{f2}$, $r_{f2}$]} for determining Π(i) = ($f_1$ × i + $f_2$ × $i^2$) mod K

| {K, $f_1$, $f_2$} | P | wgs | {K, [$q_{f1}$, $r_{f1}$], [$q_{f2}$, $r_{f2}$]} |
|---|---|---|---|
| {40, 3, 10} | 1 | 40 | {40, [0, 3], [0, 10]} |
| {48, 7, 12} | 1 | 48 | {48, [0, 7], [0, 12]} |
| {56, 19, 42} | 1 | 56 | {56, [0, 19], [0, 42]} |
| {64, 7, 16} | 1 | 64 | {64, [0, 7], [0, 16]} |
| {72, 7, 18} | 1 | 72 | {72, [0, 7], [0, 18]} |
| {80, 11, 20} | 1 | 80 | {80, [0, 11], [0, 20]} |
| {88, 5, 22} | 1 | 88 | {88, [0, 5], [0, 22]} |
| {96, 11, 24} | 1 | 96 | {96, [0, 11], [0, 24]} |
| {104, 7, 26} | 1 | 104 | {104, [0, 7], [0, 26]} |
| {112, 41, 84} | 1 | 112 | {112, [0, 41], [0, 84]} |
| {120, 103, 90} | 1 | 120 | {120, [0, 103], [0, 90]} |
| {128, 15, 32} | 2 | 64 | {128, [0, 15], [0, 32]} |
| {136, 9, 34} | 2 | 68 | {136, [0, 9], [0, 34]} |
| {144, 17, 108} | 2 | 72 | {144, [0, 17], [1, 36]} |
| {152, 9, 38} | 2 | 76 | {152, [0, 9], [0, 38]} |
| {160, 21, 120} | 2 | 80 | {160, [0, 21], [1, 40]} |
| {168, 101, 84} | 2 | 84 | {168, [1, 17], [1, 0]} |
| {176, 21, 44} | 2 | 88 | {176, [0, 21], [0, 44]} |
| {184, 57, 46} | 2 | 92 | {184, [0, 57], [0, 46]} |
| {192, 23, 48} | 2 | 96 | {192, [0, 23], [0, 48]} |
| {200, 13, 50} | 2 | 100 | {200, [0, 13], [0, 50]} |
| {208, 27, 52} | 2 | 104 | {208, [0, 27], [0, 52]} |
| {216, 11, 36} | 2 | 108 | {216, [0, 11], [0, 36]} |
| {224, 27, 56} | 2 | 112 | {224, [0, 27], [0, 56]} |
| {232, 85, 58} | 2 | 116 | {232, [0, 85], [0, 58]} |
| {240, 29, 60} | 2 | 120 | {240, [0, 29], [0, 60]} |
| {248, 33, 62} | 2 | 124 | {248, [0, 33], [0, 62]} |
| {256, 15, 32} | 4 | 64 | {256, [0, 15], [0, 32]} |
| {264, 17, 198} | 4 | 66 | {264, [0, 17], [3, 0]} |
| {272, 33, 68} | 4 | 68 | {272, [0, 33], [1, 0]} |
| {280, 103, 210} | 4 | 70 | {280, [1, 33], [3, 0]} |
| {288, 19, 36} | 4 | 72 | {288, [0, 19], [0, 36]} |
| {296, 19, 74} | 4 | 74 | {296, [0, 19], [1, 0]} |
| {304, 37, 76} | 4 | 76 | {304, [0, 37], [1, 0]} |
| {312, 19, 78} | 4 | 78 | {312, [0, 19], [1, 0]} |
| {320, 21, 120} | 4 | 80 | {320, [0, 21], [1, 40]} |
| {328, 21, 82} | 4 | 82 | {328, [0, 21], [1, 0]} |
| {336, 115, 84} | 4 | 84 | {336, [1, 31], [1, 0]} |
| {344, 193, 86} | 4 | 86 | {344, [2, 21], [1, 0]} |
| {352, 21, 44} | 4 | 88 | {352, [0, 21], [0, 44]} |
| {360, 133, 90} | 4 | 90 | {360, [1, 43], [1, 0]} |
| {368, 81, 46} | 4 | 92 | {368, [0, 81], [0, 46]} |
| {376, 45, 94} | 4 | 94 | {376, [0, 45], [1, 0]} |
| {384, 23, 48} | 4 | 96 | {384, [0, 23], [0, 48]} |
| {392, 243, 98} | 4 | 98 | {392, [2, 47], [1, 0]} |
| {400, 151, 40} | 4 | 100 | {400, [1, 51], [0, 40]} |
| {408, 155, 102} | 4 | 102 | {408, [1, 53], [1, 0]} |
| {416, 25, 52} | 4 | 104 | {416, [0, 25], [0, 52]} |
| {424, 51, 106} | 4 | 106 | {424, [0, 51], [1, 0]} |
| {432, 47, 72} | 4 | 108 | {432, [0, 47], [0, 72]} |
| {440, 91, 110} | 4 | 110 | {440, [0, 91], [1, 0]} |
| {448, 29, 168} | 4 | 112 | {448, [0, 29], [1, 56]} |
| {456, 29, 114} | 4 | 114 | {456, [0, 29], [1, 0]} |
| {464, 247, 58} | 4 | 116 | {464, [2, 15], [0, 58]} |
| {472, 29, 118} | 4 | 118 | {472, [0, 29], [1, 0]} |

TABLE 2-continued

Values of {K, [q_{f1}, r_{f1}], [q_{f2}, r_{f2}]} for determining $\Pi(i) = (f_1 \times i + f_2 \times i^2) \bmod K$

| {K, f_1, f_2} | P | wgs | {K, [q_{f1}, r_{f1}], [q_{f2}, r_{f2}]} |
|---|---|---|---|
| {480, 89, 180} | 4 | 120 | {480, [0, 89], [1, 60]} |
| {488, 91, 122} | 4 | 122 | {488, [0, 91], [1, 0]} |
| {496, 157, 62} | 4 | 124 | {496, [1, 33], [0, 62]} |
| {504, 55, 84} | 4 | 126 | {504, [0, 55], [0, 84]} |
| {512, 31, 64} | 8 | 64 | {512, [0, 31], [1, 0]} |
| {528, 17, 66} | 8 | 66 | {528, [0, 17], [1, 0]} |
| {544, 35, 68} | 8 | 68 | {544, [0, 35], [1, 0]} |
| {560, 227, 420} | 8 | 70 | {560, [3, 17], [6, 0]} |
| {576, 65, 96} | 8 | 72 | {576, [0, 65], [1, 24]} |
| {592, 19, 74} | 8 | 74 | {592, [0, 19], [1, 0]} |
| {608, 37, 76} | 8 | 76 | {608, [0, 37], [1, 0]} |
| {624, 41, 234} | 8 | 78 | {624, [0, 41], [3, 0]} |
| {640, 39, 80} | 8 | 80 | {640, [0, 39], [1, 0]} |
| {656, 185, 82} | 8 | 82 | {656, [2, 21], [1, 0]} |
| {672, 43, 252} | 8 | 84 | {672, [0, 43], [3, 0]} |
| {688, 21, 86} | 8 | 86 | {688, [0, 21], [1, 0]} |
| {704, 155, 44} | 8 | 88 | {704, [1, 67], [0, 44]} |
| {720, 79, 120} | 8 | 90 | {720, [0, 79], [1, 30]} |
| {736, 139, 92} | 8 | 92 | {736, [1, 47], [1, 0]} |
| {752, 23, 94} | 8 | 94 | {752, [0, 23], [1, 0]} |
| {768, 217, 48} | 8 | 96 | {768, [2, 25], [0, 48]} |
| {784, 25, 98} | 8 | 98 | {784, [0, 25], [1, 0]} |
| {800, 17, 80} | 8 | 100 | {800, [0, 17], [0, 80]} |
| {816, 127, 102} | 8 | 102 | {816, [1, 25], [1, 0]} |
| {832, 25, 52} | 8 | 104 | {832, [0, 25], [0, 52]} |
| {848, 239, 106} | 8 | 106 | {848, [2, 27], [1, 0]} |
| {864, 17, 48} | 8 | 108 | {864, [0, 17], [0, 48]} |
| {880, 137, 110} | 8 | 110 | {880, [1, 27], [1, 0]} |
| {896, 215, 112} | 8 | 112 | {896, [1, 103], [1, 0]} |
| {912, 29, 114} | 8 | 114 | {912, [0, 29], [1, 0]} |
| {928, 15, 58} | 8 | 116 | {928, [0, 15], [0, 58]} |
| {944, 147, 118} | 8 | 118 | {944, [1, 29], [1, 0]} |
| {960, 29, 60} | 8 | 120 | {960, [0, 29], [0, 60]} |
| {976, 59, 122} | 8 | 122 | {976, [0, 59], [1, 0]} |
| {992, 65, 124} | 8 | 124 | {992, [0, 65], [1, 0]} |
| {1008, 55, 84} | 8 | 126 | {1008, [0, 55], [0, 84]} |
| {1024, 31, 64} | 16 | 64 | {1024, [0, 31], [1, 0]} |
| {1056, 17, 66} | 16 | 66 | {1056, [0, 17], [1, 0]} |
| {1088, 171, 204} | 16 | 68 | {1088, [2, 35], [3, 0]} |
| {1120, 67, 140} | 16 | 70 | {1120, [0, 67], [2, 0]} |
| {1152, 35, 72} | 16 | 72 | {1152, [0, 35], [1, 0]} |
| {1184, 19, 74} | 16 | 74 | {1184, [0, 19], [1, 0]} |
| {1216, 39, 76} | 16 | 76 | {1216, [0, 39], [1, 0]} |
| {1248, 19, 78} | 16 | 78 | {1248, [0, 19], [1, 0]} |
| {1280, 199, 240} | 16 | 80 | {1280, [2, 39], [3, 0]} |
| {1312, 21, 82} | 16 | 82 | {1312, [0, 21], [1, 0]} |
| {1344, 211, 252} | 16 | 84 | {1344, [2, 43], [3, 0]} |
| {1376, 21, 86} | 16 | 86 | {1376, [0, 21], [1, 0]} |
| {1408, 43, 88} | 16 | 88 | {1408, [0, 43], [1, 0]} |
| {1440, 149, 60} | 16 | 90 | {1440, [1, 59], [0, 60]} |
| {1472, 45, 92} | 16 | 92 | {1472, [0, 45], [1, 0]} |
| {1504, 49, 846} | 16 | 94 | {1504, [0, 49], [9, 0]} |
| {1536, 71, 48} | 16 | 96 | {1536, [0, 71], [0, 48]} |
| {1568, 13, 28} | 16 | 98 | {1568, [0, 13], [0, 28]} |
| {1600, 17, 80} | 16 | 100 | {1600, [0, 17], [0, 80]} |
| {1632, 25, 102} | 16 | 102 | {1632, [0, 25], [1, 0]} |
| {1664, 183, 104} | 16 | 104 | {1664, [1, 79], [1, 0]} |
| {1696, 55, 954} | 16 | 106 | {1696, [0, 55], [9, 0]} |
| {1728, 127, 96} | 16 | 108 | {1728, [1, 19], [0, 96]} |
| {1760, 27, 110} | 16 | 110 | {1760, [0, 27], [1, 0]} |
| {1792, 29, 112} | 16 | 112 | {1792, [0, 29], [1, 0]} |
| {1824, 29, 114} | 16 | 114 | {1824, [0, 29], [1, 0]} |
| {1856, 57, 116} | 16 | 116 | {1856, [0, 57], [1, 0]} |
| {1888, 45, 354} | 16 | 118 | {1888, [0, 45], [3, 0]} |
| {1920, 31, 120} | 16 | 120 | {1920, [0, 31], [1, 0]} |
| {1952, 59, 610} | 16 | 122 | {1952, [0, 59], [5, 0]} |
| {1984, 185, 124} | 16 | 124 | {1984, [1, 61], [1, 0]} |
| {2016, 113, 420} | 16 | 126 | {2016, [0, 113], [3, 42]} |
| {2048, 31, 64} | 32 | 64 | {2048, [0, 31], [1, 0]} |
| {2112, 17, 66} | 32 | 66 | {2112, [0, 17], [1, 0]} |
| {2176, 171, 136} | 32 | 68 | {2176, [2, 35], [2, 0]} |
| {2240, 209, 420} | 32 | 70 | {2240, [2, 69], [6, 0]} |
| {2304, 253, 216} | 32 | 72 | {2304, [3, 37], [3, 0]} |
| {2368, 367, 444} | 32 | 74 | {2368, [4, 71], [6, 0]} |
| {2432, 265, 456} | 32 | 76 | {2432, [3, 37], [6, 0]} |
| {2496, 181, 468} | 32 | 78 | {2496, [2, 25], [6, 0]} |
| {2560, 39, 80} | 32 | 80 | {2560, [0, 39], [1, 0]} |
| {2624, 27, 164} | 32 | 82 | {2624, [0, 27], [2, 0]} |
| {2688, 127, 504} | 32 | 84 | {2688, [1, 43], [6, 0]} |
| {2752, 143, 172} | 32 | 86 | {2752, [1, 57], [2, 0]} |
| {2816, 43, 88} | 32 | 88 | {2816, [0, 43], [1, 0]} |
| {2880, 29, 300} | 32 | 90 | {2880, [0, 29], [3, 30]} |
| {2944, 45, 92} | 32 | 92 | {2944, [0, 45], [1, 0]} |
| {3008, 157, 188} | 32 | 94 | {3008, [1, 63], [2, 0]} |
| {3072, 47, 96} | 32 | 96 | {3072, [0, 47], [1, 0]} |
| {3136, 13, 28} | 32 | 98 | {3136, [0, 13], [0, 28]} |
| {3200, 111, 240} | 32 | 100 | {3200, [1, 11], [2, 40]} |
| {3264, 443, 204} | 32 | 102 | {3264, [4, 35], [2, 0]} |
| {3328, 51, 104} | 32 | 104 | {3328, [0, 51], [1, 0]} |
| {3392, 51, 212} | 32 | 106 | {3392, [0, 51], [2, 0]} |
| {3456, 451, 192} | 32 | 108 | {3456, [4, 19], [1, 84]} |
| {3520, 257, 220} | 32 | 110 | {3520, [2, 37], [2, 0]} |
| {3584, 57, 336} | 32 | 112 | {3584, [0, 57], [3, 0]} |
| {3648, 313, 228} | 32 | 114 | {3648, [2, 85], [2, 0]} |
| {3712, 271, 232} | 32 | 116 | {3712, [2, 39], [2, 0]} |
| {3776, 179, 236} | 32 | 118 | {3776, [1, 61], [2, 0]} |
| {3840, 331, 120} | 32 | 120 | {3840, [2, 91], [1, 0]} |
| {3904, 363, 244} | 32 | 122 | {3904, [2, 119], [2, 0]} |
| {3968, 375, 248} | 32 | 124 | {3968, [3, 3], [2, 0]} |
| {4032, 127, 168} | 32 | 126 | {4032, [1, 1], [1, 42]} |
| {4096, 31, 64} | 32 | 128 | {4096, [0, 31], [0, 64]} |
| {4160, 33, 130} | 32 | 130 | {4160, [0, 33], [1, 0]} |
| {4224, 43, 264} | 32 | 132 | {4224, [0, 43], [2, 0]} |
| {4288, 33, 134} | 32 | 134 | {4288, [0, 33], [1, 0]} |
| {4352, 477, 408} | 32 | 136 | {4352, [3, 69], [3, 0]} |
| {4416, 35, 138} | 32 | 138 | {4416, [0, 35], [1, 0]} |
| {4480, 233, 280} | 32 | 140 | {4480, [1, 93], [2, 0]} |
| {4544, 357, 142} | 32 | 142 | {4544, [2, 73], [1, 0]} |
| {4608, 337, 480} | 32 | 144 | {4608, [2, 49], [3, 48]} |
| {4672, 37, 146} | 32 | 146 | {4672, [0, 37], [1, 0]} |
| {4736, 71, 444} | 32 | 148 | {4736, [0, 71], [3, 0]} |
| {4800, 71, 120} | 32 | 150 | {4800, [0, 71], [0, 120]} |
| {4864, 37, 152} | 32 | 152 | {4864, [0, 37], [1, 0]} |
| {4928, 39, 462} | 32 | 154 | {4928, [0, 39], [3, 0]} |
| {4992, 127, 234} | 32 | 156 | {4992, [0, 127], [1, 78]} |
| {5056, 39, 158} | 32 | 158 | {5056, [0, 39], [1, 0]} |
| {5120, 39, 80} | 32 | 160 | {5120, [0, 39], [0, 80]} |
| {5184, 31, 96} | 32 | 162 | {5184, [0, 31], [0, 96]} |
| {5248, 113, 902} | 32 | 164 | {5248, [0, 113], [5, 82]} |
| {5312, 41, 166} | 32 | 166 | {5312, [0, 41], [1, 0]} |
| {5376, 251, 336} | 32 | 168 | {5376, [1, 83], [2, 0]} |
| {5440, 43, 170} | 32 | 170 | {5440, [0, 43], [1, 0]} |
| {5504, 21, 86} | 32 | 172 | {5504, [0, 21], [0, 86]} |
| {5568, 43, 174} | 32 | 174 | {5568, [0, 43], [1, 0]} |
| {5632, 45, 176} | 32 | 176 | {5632, [0, 45], [1, 0]} |
| {5696, 45, 178} | 32 | 178 | {5696, [0, 45], [1, 0]} |
| {5760, 161, 120} | 32 | 180 | {5760, [0, 161], [0, 120]} |
| {5824, 89, 182} | 32 | 182 | {5824, [0, 89], [1, 0]} |
| {5888, 323, 184} | 32 | 184 | {5888, [1, 139], [1, 0]} |
| {5952, 47, 186} | 32 | 186 | {5952, [0, 47], [1, 0]} |
| {6016, 23, 94} | 32 | 188 | {6016, [0, 23], [0, 94]} |
| {6080, 47, 190} | 32 | 190 | {6080, [0, 47], [1, 0]} |
| {6144, 263, 480} | 32 | 192 | {6144, [1, 71], [2, 96]} |

TABLE 3

Values of $i \cdot i \bmod cf$ for $cf = \{64, 48, 40, 112, 18, 54\}$

| cf | i · i mod cf |
|---|---|
| 64 | {0, 1, 4, 9, 16, 25, 36, 49, 0, 17, 36, 57, 16, 41, 4, 33, 0} |
| 48 | {0, 1, 4, 9, 16, 25, 36, 1, 16, 33, 4, 25, 0} |
| 40 | {0, 1, 4, 9, 16, 25, 36, 9, 24, 1, 20} |
| 112 | {0, 1, 4, 9, 16, 25, 36, 49, 64, 81, 100, 9, 32, 57, 84, 1, 32, 65, 100, 25, 64, 105, 36, 81, 16, 65, 4, 57, 0} |

TABLE 3-continued

Values of i · i mod cf for cf = {64, 48, 40, 112, 18, 54}

| cf | i · i mod cf |
|---|---|
| 18 | {0, 1, 4, 9, 16, 7, 0, 13, 10, 9} |
| 54 | {0, 1, 4, 9, 16, 25, 36, 49, 10, 27, 46, 13, 36, 7, 34, 9, 40, 19, 0, 37, 22, 9, 52, 43, 36, 31, 28, 27} |

The invention claimed is:

1. A method of processing data within a data transceiver, the method comprising:
   receiving from a data interface of a data transceiver, a symbol sequence comprising an input data block;
   storing, based on the receiving, the symbol sequence in a receive buffer;
   determining, within a processor of the data transceiver based on the storing, an interleaved symbol location based on an interleaver sequence function which relates a linear symbol location to the interleaved symbol location by:
      acquiring parameters of the interleaver sequence function in quotient and remainder form with respect to a divisor value of wgs, where wgs equates to K/P, wherein K is code block size of the symbol sequence, P is a parallelization factor equivalent to the number of decoding processors, and P greater than 1,
      the parameters comprising constant $f_1$ and constant $f_2$ expressed in quotient and remainder form $f_1[q,r]$ and $f_2[q,r]$, wherein q is the quotient of $f_1$ or $f_2$ in integer form and r is the remainder of $f_1$ or $f_2$ in integer form with respect to a divisor value of wgs;
      calculating the interleaved symbol location $\Pi(i)=(f_1 \times i + f_2 \times i^2)$ mod wgs in quotient and remainder form, wherein i is the linear symbol location;
   storing a symbol from a linear symbol location i within an input data block of the receive buffer into the determined interleaved symbol location of an output data block of an output buffer; and
   transmitting, based on storing the symbol from a linear symbol location i, data in the output buffer through an output of the data transceiver.

2. The method of claim 1, wherein multiple values for $f_1[q,r]$ and $f_2[q,r]$ in quotient and remainder form are stored in and acquired from memory.

3. The method of claim 1, wherein the parameters of the interleaver sequence function comprise, for each value of K, a respective value of $f_1$ and a respective value of $f_2$,
   the method further comprising storing into a table for each value of K, the respective value of $f_1$ and the respective value of $f_2$ in the quotient and remainder form, $f_1[q,r]$ and $f_2[q,r]$, and
   wherein the acquiring parameters comprises at least one lookup operation to retrieve the value of $f_1$ and $f_2$ in the quotient and remainder form, $f_1[q,r]$ and $f_2[q,r]$ from the table, and
   the calculating comprises at least one iterative shift-add operation.

4. The method of claim 1, further comprising iteratively determining interleaved symbol locations for one or more successive symbol locations.

5. The method of claim 1, wherein the calculating comprises:
   operating on a remainder portion of the interleaver sequence function applying modulo wgs arithmetic; and
   adjusting, based on determining the operating on the remainder produces a value greater than wgs, a quotient portion of the interleaver sequence function.

6. The method of claim 1, wherein the data interface and the output of the data transceiver respectively comprise one of:
   a data interface to equipment external to the data transceiver and a radio data transmitter, or
   a data demodulator demodulating received RF data signals and the data interface to equipment external to the data transceiver.

7. A non-transitory computer readable medium having computer executable instructions stored thereon that, when executed by a processing circuit, cause the processing circuit to:
   receive from a data interface of a data transceiver, a symbol sequence comprising an input data block;
   store, based on the receiving, the symbol sequence in a receive buffer;
   determine, based on storing the symbol sequence, an interleaved symbol location based on an interleaver sequence function which relates a linear symbol location to the interleaved symbol location by:
   acquire parameters of the interleaver sequence function in quotient and remainder form with respect to a divisor value of wgs, where wgs equates to K/P, wherein K is code block size of the symbol sequence, P is a parallelization factor equivalent to the number of decoding processors, and P greater than 1,
      the parameters comprising constant $f_1$ and constant $f_2$ expressed in quotient and remainder form $f_1[q,r]$ and $f_2[q,r]$, wherein q is the quotient of $f_1$ or $f_2$ in integer form and r is the remainder of $f_1$ or $f_2$ in integer form with respect to a divisor value of wgs;
   calculate the interleaved symbol location $\Pi(i)=(f_1 \times i + f_2 \times i^2)$ mod wgs in quotient and remainder form, wherein i is the linear symbol location;
   store a symbol from a linear symbol location i within an input data block of the receive buffer into the determined interleaved symbol location of an output data block of an output buffer; and
   transmit, based on storing the symbol from a linear symbol location i, data in the output buffer through an output of the data transceiver.

8. The non-transitory computer readable medium of claim 7, wherein multiple values for $f_1[q,r]$ and $f_2[q,r]$ in quotient and remainder form are stored in and acquired from memory.

9. The non-transitory computer readable medium of claim 7, wherein the parameters of the interleaver sequence function comprise, for each value of K, a respective value of $f_1$ and a respective value of $f_2$, and
   the instructions further cause the processing circuit to store into a table for each value of K, the respective value of $f_1$ and the respective value of $f_2$ in the quotient and remainder form, $f_1[q,r]$ and $f_2[q,r]$, and
   wherein the instructions further cause the processing circuit to acquire parameters by at least one lookup operation to retrieve the value of $f_1$ and $f_2$ in the quotient and remainder form, $f_1[q,r]$ and $f_2[q,r]$ from the table, and
   the instructions further cause the processing circuit to calculate by at least one iterative shift-add operation.

10. The non-transitory computer readable medium of claim 7, wherein the instructions further cause the processing circuit to calculate by:
   operating on a remainder portion of the interleaver sequence function applying modulo wgs arithmetic; and adjusting, based on determining the operating on the remainder produces a value greater than wgs, a quotient portion of the interleaver sequence function.

11. A data processor, comprising:
a data interface of a data transceiver configured to receive a symbol sequence comprising an input data block;
a receiving buffer configured to store, based on receipt of the symbol sequence, the symbol sequence;
a processing circuit configured to determine the interleaved symbol location based on an interleaver sequence function which relates a linear symbol location to the interleaved symbol location by:
acquiring parameters of the interleaver sequence function in quotient and remainder form with respect to a divisor value of wgs, where wgs equates to K/P, wherein K is code block size of the symbol sequence, P is a parallelization factor equivalent to the number of decoding processors, and P greater than 1,
the parameters comprising constant $f_1$ and constant $f_2$ expressed in quotient and remainder form $f_1[q,r]$ and $f_2[q,r]$, where q is the quotient of $f_1$ or $f_2$ in integer form and r is the remainder of $f_1$ or $f_2$ in integer form with respect to a divisor value of wgs; and
calculating the interleaved symbol location $\Pi(i)=(f_1 \times i + f_2 \times i^2)$ mod wgs in quotient and remainder form, wherein i is the linear symbol location;
wherein the processing circuit is further configured to:
store a symbol from a linear symbol location i within an input data block of the receive buffer into the determined interleaved symbol location of an output data block of an output buffer; and
transmit, based on storing the symbol from a linear symbol location i, data in the output buffer through an output of the data transceiver.

12. The data processor of claim 11, wherein the parameters of the interleaver sequence function comprise, for each value of K, a respective value of $f_1$ and a respective value of $f_2$,
the processing circuit is further configured to store into a table for each value of K, the respective value of $f_1$ and the respective value of $f_2$ in the quotient and remainder form, $f_1[q,r]$ and $f_2[q,r]$, and
wherein the processing circuit is configured to perform at least one lookup operation and at least one iterative shift-add operation during calculation of the interleaved symbol sequence index.

13. The data processor of claim 11, wherein the processor is configured to iteratively determine interleaved symbol locations for one or more successive symbol locations.

14. A device comprising the data processor of claim 11 and further comprising memory storing multiple values for $f_1[q,r]$ and $f_2[q,r]$ in quotient and remainder form, wherein the processing circuit is configured to acquire values for $f_1[q,r]$ and $f_2[q,r]$ in quotient and remainder form from the memory.

15. The device of claim 14, further comprising an encoder for encoding a symbol sequence, wherein the encoder is configured to perform an interleaving operation by successively passing a symbol location of the symbol sequence to the interleaver and thereby obtain a corresponding interleaved symbol location from the interleaver.

16. User equipment for use in a telecommunications network comprising the device of claim 14.

* * * * *